(12) United States Patent
Kabasawa et al.

(10) Patent No.: US 9,466,467 B2
(45) Date of Patent: Oct. 11, 2016

(54) ION IMPLANTATION APPARATUS

(71) Applicant: Sumitomo Heavy Industries Ion Technology Co., Ltd., Tokyo (JP)

(72) Inventors: Mitsuaki Kabasawa, Ehime (JP); Kazuhiro Watanabe, Ehime (JP); Hitoshi Ando, Ehime (JP); Kouji Inada, Ehime (JP); Tatsuya Yamada, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 492 days.

(21) Appl. No.: 14/096,735

(22) Filed: Dec. 4, 2013

(65) Prior Publication Data

US 2014/0150723 A1 Jun. 5, 2014

(30) Foreign Application Priority Data

Dec. 4, 2012 (JP) .................. 2012-265844

(51) Int. Cl.
*H01J 37/00* (2006.01)
*H01J 37/32* (2006.01)
*H01J 37/30* (2006.01)
*H01J 37/317* (2006.01)

(52) U.S. Cl.
CPC ...... *H01J 37/32412* (2013.01); *H01J 37/3007* (2013.01); *H01J 37/3171* (2013.01); *H01J 2237/057* (2013.01); *H01J 2237/10* (2013.01)

(58) Field of Classification Search
CPC ........... H01J 37/32412; H01J 37/3007; H01J 37/3171; H01J 2237/10; H01J 2237/057
USPC ........................................... 250/492.1–492.3
See application file for complete search history.

(56) References Cited

U.S. PATENT DOCUMENTS

| 5,300,891 A | 4/1994 | Tokoro |
| 8,035,080 B2 * | 10/2011 | Satoh ..................... H01J 37/08 250/282 |

FOREIGN PATENT DOCUMENTS

| JP | S50-9898 | 1/1975 |
| JP | 09-246674 A | 9/1997 |
| JP | H10-283977 A | 10/1998 |
| JP | 2002-231178 A | 8/2002 |
| JP | 3374335 B2 | 2/2003 |
| JP | 2004-508680 A | 3/2004 |
| JP | 2006-202546 A | 8/2006 |
| JP | 2012-525678 A | 10/2012 |
| WO | WO-02/21565 A2 | 3/2002 |
| WO | WO-2010/126470 A1 | 11/2010 |

* cited by examiner

*Primary Examiner* — Michael Maskell
(74) *Attorney, Agent, or Firm* — Michael Best & Friedrich LLP

(57) ABSTRACT

An ion implantation apparatus includes: a plurality of units for accelerating an ion beam generated in an ion source; and a plurality of units for adjusting a scan beam and implanting ions into a wafer. A horizontal U-shaped folder type beamline having opposite long straight portions includes the plurality of units for adjusting the scan beam in a long straight portion to have substantially the same length as the ion source and the plurality of units for accelerating the ion beam.

11 Claims, 10 Drawing Sheets

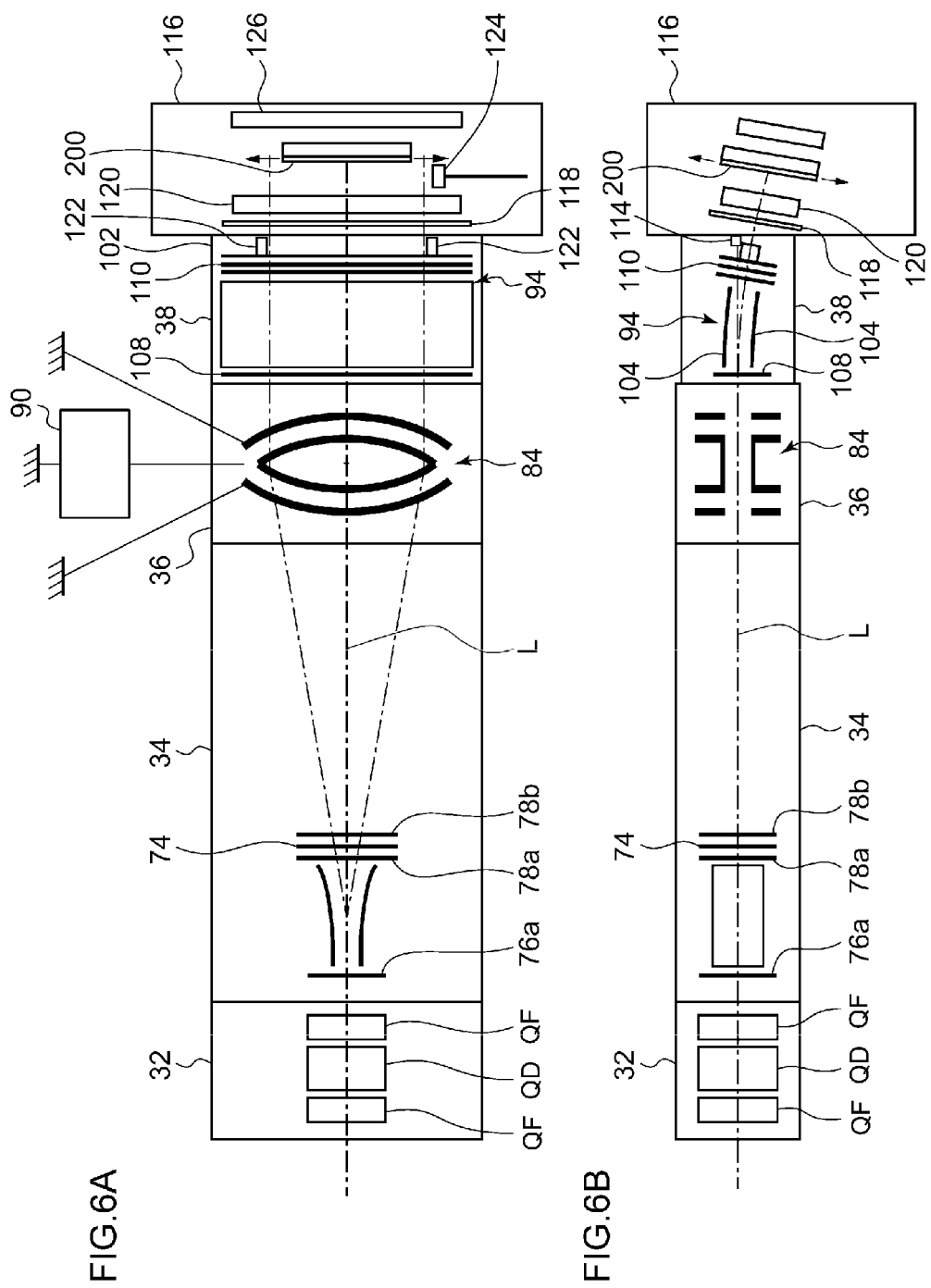

ION IMPLANTATION APPARATUS

BACKGROUND OF THE INVENTION

1. Field of the Invention

The present invention relates to an ion implantation apparatus.

2. Description of the Related Art

In a semiconductor device manufacturing process, an important process for making the semiconductor wafer into a semiconductor device is performed by adding impurities to a crystal of a semiconductor wafer using method of implanting ions into the semiconductor wafer in vacuum to change conductivity. An apparatus used in this process is referred to as an ion implantation apparatus that generally implants ions into a semiconductor wafer by accelerating impurity atoms as ions for making a semiconductor device.

Recently, with high integration and high performance of the semiconductor device, there is a need for higher performance to realize high-energy ion implantation for implanting ions into a deeper portion of the semiconductor wafer. In order to realize such high performance, for example, there is a method of configuring an ion beam acceleration system with a tandem-type accelerator.

Also, a conventional single-wafer type high-energy ion implanter is intended to implant a uniform amount of high-energy ions at a uniform angle on an entire surface of the wafer by using a Van de Graaff type tandem accelerator or a heavy ion linear accelerator (linac) in an acceleration unit and using a filtering magnet (for valence separation in the case of the tandem, and for energy analysis in the case of the linac), a beam scanner (device for generating a scan beam by a low-frequency electric field or magnetic field), and a magnetic field collimating magnet (electromagnet for collimating a scan trajectory of a scanned beam from a center trajectory in alignment with a central trajectory direction), which are provided in a downstream. Ion energy is about 3 to 4 MeV.

If high-energy ions are implanted into a wafer with a photoresist, a large amount of outgas is generated, and a valence of some ions is changed by the interaction between gas molecules of the outgas and beam ions. If the valence is changed during passage of the magnetic field collimating magnet, a deflection angle of collimation is changed, and thus an implantation angle to a wafer is not uniform. Also, the amount (number) of ions implanted is calculated by measuring a beam current value in a Faraday cup disposed near a wafer. However, the measured value fluctuates out of an expected implantation value according to the change of the valence, and thus characteristics of a semiconductor device are not obtained as expected. Also, since the collimation by the magnetic field (collimator magnet) has different deflection angles and trajectory lengths in an inner trajectory and an outer trajectory, the ratio of ions whose valence is changed increases toward the outer trajectory, degrading implantation uniformity within a wafer plane.

Also, the magnetic field collimating parallel magnet requires a wide magnetic pole in a scan direction and a relatively long collimation section. As energy is higher, the magnetic pole also becomes longer and larger and the weight significantly increases. Therefore, in order to safely install and maintain the apparatus, it is necessary to reinforce a strength design of a semiconductor factory itself, and power consumption significantly increases.

On the other hand, a portion of a single-wafer type medium-current ion implanter having relatively lower energy than the single-wafer type high-energy ion implanter uses an electrostatic (electrode type) parallel lens and an electrostatic (electrode type) energy filter (angular energy filter (AEF)) in order to avoid the drawbacks of the parallel electromagnet. The electrostatic parallel lens collimates a scan trajectory in alignment with a central trajectory direction while maintaining the symmetry of trajectory, and the AEF removes ions whose valence is changed immediately before the wafer. Therefore, even when a large amount of outgas exists, a beam having no energy contamination can be obtained, and a variation in implantation angle in a scan direction such as the magnetic field collimating parallel magnet does not occur. As a result, it is possible to uniformly implant ions having an exact implantation distribution in a depth direction and an exact implantation amount (dose), and the implantation angle is uniform. Thus, ion implantation having very high accuracy is realized. Also, a lightweight electrode member is used, and power consumption is small as compared with the electromagnet.

However, when the beam ions are deflected toward the same angle, a required magnetic field is in proportion to a square root of energy, whereas a required electric field is in proportion to energy itself. Therefore, since the length of the deflection magnetic pole in the magnetic field collimation is in proportion to the square root of the energy but the deflection electrode in the electric field collimation is lengthened in proportion to the energy, the beam transport system (distance from the scanner to the wafer) becomes relatively long when intending to realize the high-accuracy angle implantation in high-energy ion implantation. Also, it is necessary to supply an electrode with a voltage having very high accuracy and stability, but a voltage dynamic range required to an electrode power supply in the electric field collimation in order to cover an implantation energy range from low energy to high energy is much wider than a current dynamic range required to an electromagnet power supply in the magnetic field collimation.

When the advantage of the collimation angle accuracy of the medium-current ion implanter including such an electric field collimating mechanism is introduced to the high-energy ion implantator, for example, it may be considered a configuration in which constituent devices, such as an ion source, a mass analysis magnet, a tandem type accelerator or a radio-frequency linear accelerator (linac), a downstream beamline being a beam transport system including an energy filter, a beam scanner, a collimator, a final energy filter, an implantation processing chamber, and a substrate transfer device (end station), are fixed independently and in a substantially straight line. However, in this case, the total length of the apparatus becomes very long, setting and preparation of an installation site, installation work, and the like become complicated, and the installation area is also increased. Also, adjustment of fixing alignment of each device, maintenance or repair of the apparatus after the operation, and work space for adjustment are also required. Such a large-scale ion implanter cannot satisfy requirements for adjusting the apparatus size in the semiconductor manufacturing line to the actual circumstances of the production line arrangement of the factory.

SUMMARY OF THE INVENTION

The present invention has been made in consideration of such circumstances, and is directed to provide a high-accuracy high-energy ion implantation apparatus that realizes techniques for simplifying setting and preparation of an installation site and an installation work to suppress an installation area while ensuring a sufficient work area, and includes a collimating electrode and an energy filter electrode.

In order to solve the above problem, a high-energy ion implantation apparatus according to an aspect of the present invention includes: a plurality of units for accelerating an ion beam generated in an ion source; and a plurality of units for adjusting a scan beam and implanting the scan beam into a wafer, wherein a horizontal U-shaped folder (loop-back) type beamline having opposite long straight portions includes the plurality of units for adjusting the scan beam in a long straight portion to have substantially the same length as the ion source and the plurality of units for accelerating the ion beam. Such a layout is realized by configuring a unit group, such as a scanner, a parallel lens, and an energy filter, to have substantially the same length as a unit group for accelerating ions from the ion source.

Also, any combinations of the above-mentioned components and modifications of the components or the expressions of the present invention among the method, the apparatus, and the system are also effective as aspects of the present invention.

BRIEF DESCRIPTION OF THE DRAWINGS

FIG. 6A is a plan view illustrating a schematic configuration from a beam shaper to a substrate supplying/processing unit after a beam collimator from a beam scanner, and FIG. 6B is a side view illustrating a schematic configuration from the beam shaper to the substrate supplying/processing unit after the beam collimator from the beam scanner;

DETAILED DESCRIPTION OF THE INVENTION

Figure 1:
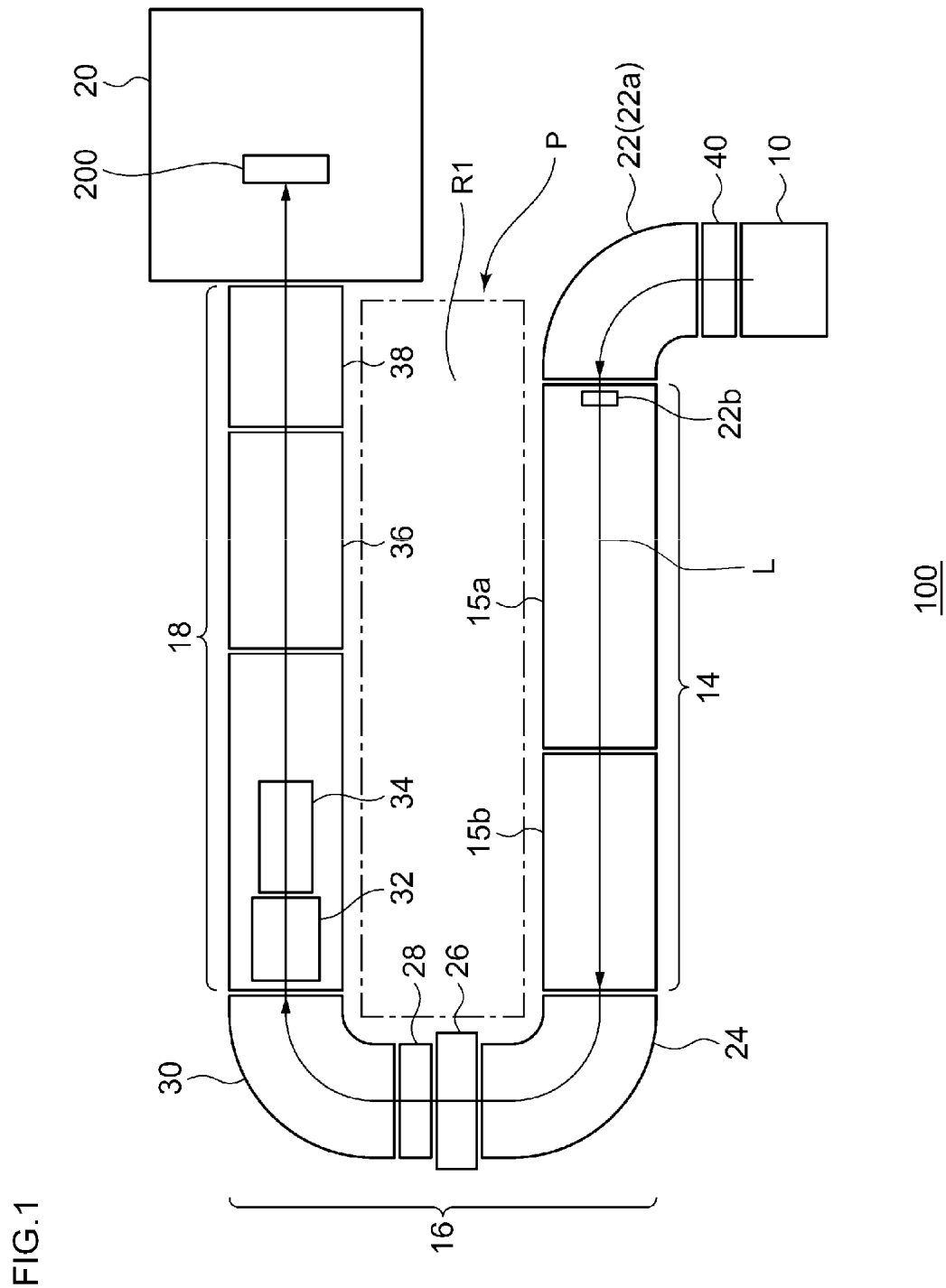
FIG. 1 is a top view illustrating a schematic layout of an ion implantation apparatus and a beamline being a beam path according to the present embodiment.

The invention will now be described by reference to the preferred embodiments. This does not intend to limit the scope of the present invention, but to exemplify the invention.

A high-energy ion implantation apparatus capable of implanting ions having high energy (for example, 1 to 4 MeV) into a substrate includes a plurality of constituent devices, for example, an ion source, a mass analysis magnet, a radio-frequency linear accelerator (linac), a beam transport system including an energy filter, a beam scanner, a beam collimator, a final energy filter, an implantation processing chamber, and a substrate transfer device. Therefore, if each of the constituent devices is independently fixed on a substantially straight line, the total length becomes very long, which requires much effort on fixing alignment of each device, maintenance, adjustment, and repair after operation.

Also, if each constituent device of the high-energy ion implantation apparatus is independently mounted on a trestle and is fixed and adjusted, the entire main devices may have a width of about 7 m and a total length of about 20 m. Recently, when a CCD or a CMOS imager is manufactured, a process of implanting ions having ultra-high energy (3 to 10 MeV) into a deep region of a substrate has been employed. In such implantation, an ultra-high-energy ion implantation apparatus is utilized. In order to realize a beamline of such ultra-high energy, it is necessary to place a lot of beamline members, mainly a long radio-frequency acceleration portion. Thus, the beamline may extend longer and larger. In this case, a wide maintenance space is inevitably taken on both sides of the beamline. Also, a length of the beamline becomes a length of the apparatus as it is, and the maintenance space on both sides of the beamline becomes a width of the apparatus as it is.

Ina semiconductor device manufacturing process, many types of semiconductor manufacturing apparatuses are provided, and the ion implantation apparatus also requires space-saving and limitation in the length of the apparatus like other apparatuses. However, in order to ensure the maintenance space as well as the size of each device within the apparatus, the size of the apparatus is increased. Because the length of the beamline becomes the length of the apparatus as it is, the apparatus tends to become longer in a direction of the beamline.

Therefore, in the present embodiment, the high-energy ion implantation apparatus having the following configuration can suppress the installation area while ensuring the workability for the ion implantation apparatus.

Hereinafter, embodiments of the present invention will be described in detail with reference to the drawings. Also, in the description of the drawings, the same reference numerals are assigned to the same elements, and a redundant description thereof is appropriately omitted. Also, the configurations described below are exemplary, and do not limit the scope of the present invention.

(High-Energy Ion Implantation Apparatus)

First, a configuration of a high-energy ion implantation apparatus according to the present embodiment will be described briefly. An ion is one type of charged particles, and the contents of this specification can also be applied to a charged particle beam apparatus as well as an ion beam apparatus.

FIG. 1 schematically illustrates a layout of an ion implantation apparatus 100 and a beamline according to the present embodiment.

The ion implantation apparatus 100 according to the present embodiment is a radio-frequency linear acceleration type ion implantation apparatus having a high-energy ion beamline, and is an ion implantation apparatus that accelerates ions generated in an ion source 10, transports the ions as an ion beam up to a wafer (substrate) 200 along a U-shaped beamline having opposite long straight portions, and implants the ions into the wafer 200. The U-shaped beamline includes a plurality of units. When the arrangement of the whole ion implantation apparatus is rectangular, the "U shape having the opposite long straight portions" may be considered as a layout in which a longitudinal direction of a high-energy multi-stage linear acceleration unit to be described below becomes a long side of the rectangular arrangement.

Each of the plurality of units is arranged substantially horizontally with reference to the same plane. Also, a work space R1 enabling operations on almost all of the plurality of units is provided in a central region of the U-shaped beamline. Also, a communication passage P is provided to enable an operator to move between the work space R1 and the outside. Therefore, the operator can easily enter up to the innermost part of the work space R1 provided in the central region of the U shape, improving the work efficiency of maintenance or adjustment.

The ion implantation apparatus (ion implanter) 100 includes an ion beam generation unit 12, a high-energy multi-stage linear acceleration unit 14, a deflection unit 16, a beam transport line unit 18, and a substrate supplying/processing unit 20. The ion beam generation unit 12 includes an ion source 10, an extraction electrode 40, and a mass analyzer 22. In the ion beam generation unit 12, a beam is extracted from the ion source 10 through the extraction electrode 40 and is simultaneously accelerated, and a mass of the extracted accelerated beam is analyzed by the mass analyzer 22. The mass analyzer 22 includes a mass analysis magnet 22a and a mass analysis slit 22b. Generally, the mass analysis slit 22b is disposed just behind the mass analysis magnet 22a, but in the embodiment, is disposed in an inlet portion of the high-energy multi-stage linear acceleration unit 14 that is a next configuration.

As a result of mass analysis by the mass analyzer 22, only ion species necessary for implantation are selected, and an ion beam of the selected ion species is guided to the following high-energy multi-stage linear acceleration unit 14. A direction of the ion beam, which is further accelerated in multi-stage by the high-energy multi-stagelinear acceleration unit 14, is changed by the deflection unit 16. The deflection unit 16 includes an energy filter 24, a trajectory adjustment quadrupole lens 26 being a trajectory adjustment lens, an energy defining slit 28, and an angle deflection magnet 30. Also, the energy filter 24 is, for example, an energy filter deflection magnet (EFM).

The beam transport line unit 18 is configured to transport the ion beam output from the deflection unit 16, and includes a beam shaper 32 provided with a converging/diverging lens group, a beam scanner 34, a beam collimator 36, and a final energy filter (angular energy filter) 38 (including a final energy separation slit). The substrate processing/substrate transferring and supplying unit 20 is provided at the end of the downstream side of the beam transport line unit 18. The substrate processing/substrate transferring and supplying unit 20 is an implantation processing chamber where the wafer 200, into which ions are implanted in the form of the ion beam, is disposed.

The ion implantation apparatus 100, in which each unit is disposed in the U shape as described above, ensures the excellent workability while suppressing the installation area. Also, in the ion implantation apparatus 100, each unit or each device is provided as a module configuration, and attachment or detachment and assembly based on a beamline reference position are possible.

Next, each unit and each device constituting the ion implantation apparatus 100 will be described in more detail.

(Ion Beam Generation Unit)

Figure 2A:
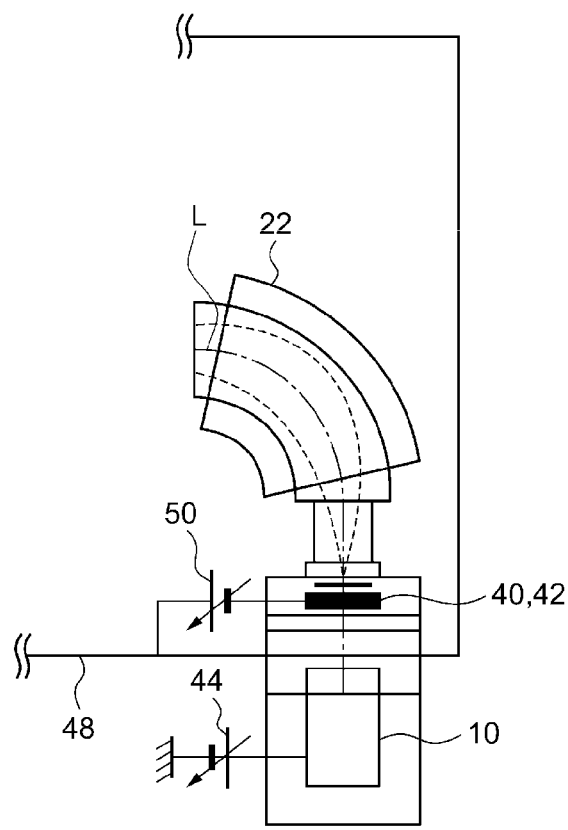
FIG. 2A is a plan view illustrating a schematic configuration of an ion beam generation unit.
Figure 2B:
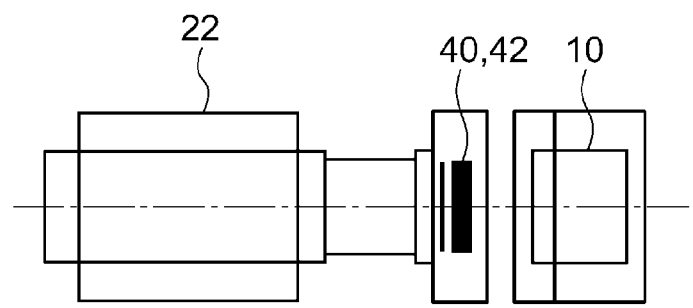
FIG. 2B is a side view illustrating a schematic configuration of the ion beam generation unit.

FIG. 2A is a plan view illustrating a schematic configuration of an ion beam generation unit, and FIG. 2B is a side view illustrating a schematic configuration of the ion beam generation unit.

As illustrated in FIGS. 2A and 2B, the extraction electrode 40 configured to extract the ion beam from plasma generated within an ion chamber is provided in an outlet side of the ion source 10 disposed at the most upstream of the beamline. In the vicinity of the downstream side of the extraction electrode 40, an extraction suppression electrode 42 is provided to suppress electrons included in the ion beam extracted from the extraction electrode 40 from flowing back toward the extraction electrode 40.

The ion source 10 is connected to the ion source high-voltage power supply 44. An extraction power supply 50 is connected between the extraction electrode 40 and a terminal 48. In the downstream side of the extraction electrode 40, the mass analyzer 22 is disposed to separate predetermined ions from the extracted ion beam.

(High-Energy Multi-Stage Linear Acceleration Unit)

Figure 3:
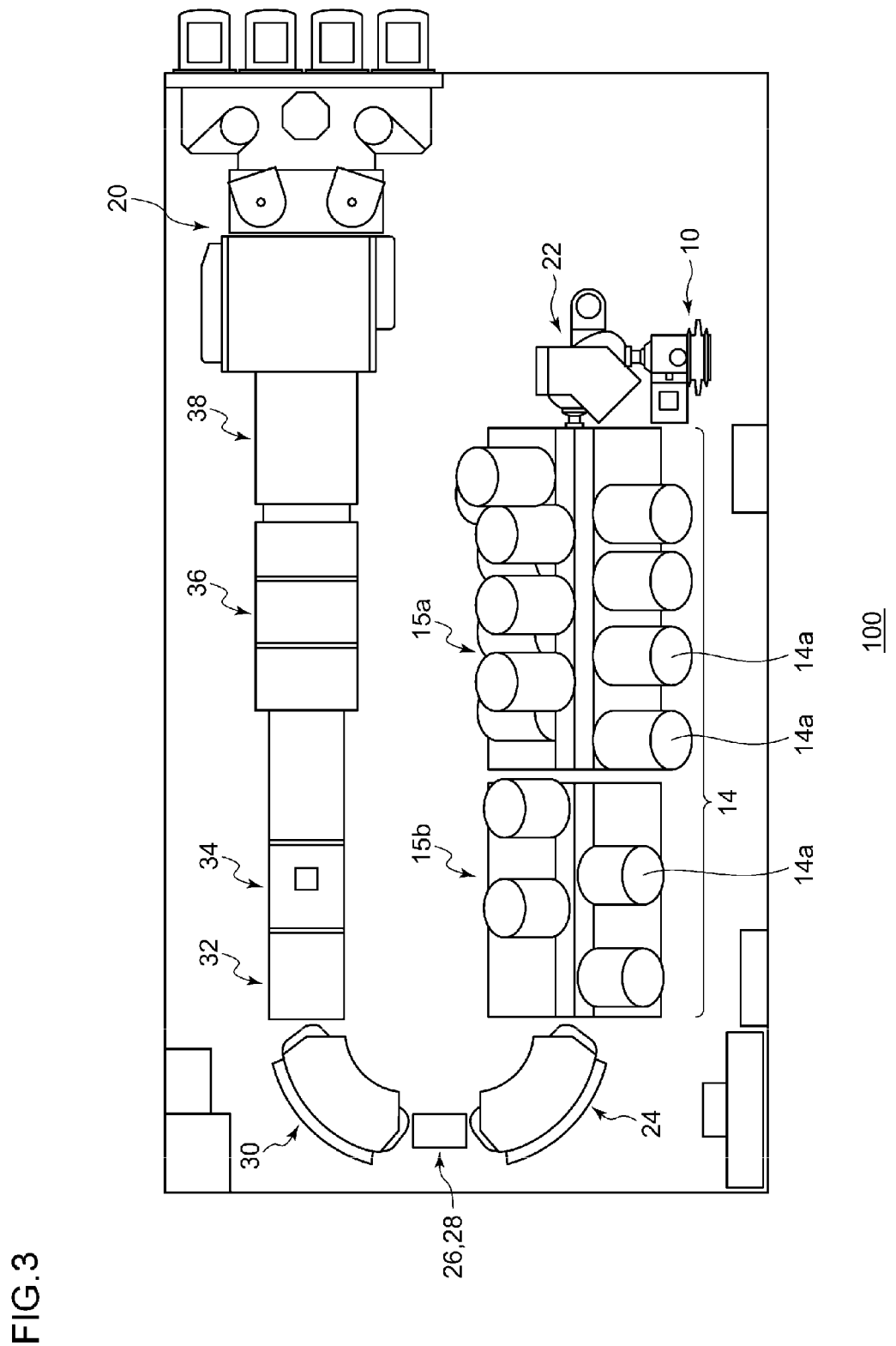
FIG. 3 is a plan view illustrating an overall layout including a schematic configuration of a high-energy multi-stage linear acceleration unit.

FIG. 3 is a plan view illustrating a schematic configuration of the high-energy multi-stage linear acceleration unit 14. The high-energy multi-stage linear acceleration unit 14 includes a plurality of linear accelerator configured to accelerate or decelerate the ion beam, that is, one or more radio-frequency resonators 14a. In other words, the high-energy multi-stage linear acceleration unit 14 can accelerate or decelerate ions by the action of a radio-frequency (RF) electric field. In FIG. 3, the high-energy multi-stage linear acceleration unit 14 includes a first linear accelerator 15a provided with a plurality of stages of basic radio-frequency resonators 14a for high-energy ion implantation, and a second linear accelerator 15b provided with a plurality of stages of additional radio-frequency resonators 14a for ultra-high-energy ion implantation.

In the ion implantation apparatus including a general acceleration system, operation parameters related to acceleration can easily be determined analytically. For example, in an acceleration method utilizing an electrostatic field used in most ion implantation apparatuses, a set voltage V [kV] of a power supply producing an electrostatic field is simply determined from desired valence of ion n and desired energy E [keV], based on the following formula (1).

$$V = E/n \qquad \text{Formula (1)}$$

In the case of using a plurality of stages of electrostatic fields, the total voltage thereof is set to V. On the other hand, in the ion implantation apparatus using radio-frequency (RF) acceleration, it is necessary to consider an amplitude V [kV] and frequency f [Hz] of a voltage as radio-frequency parameters. Also, in the case of performing a plurality of stages of radio-frequency accelerations, mutual radio-frequency phases $\phi$ [deg] are added as parameters. In addition, when there is a magnetic field lens (for example, quadrupole electromagnet) or an electrostatic field lens (for example, electrostatic quadrupole electrode) for controlling the transverse spread of the ion beam during acceleration or after acceleration by converging and diverging effects, the optimum values of the operation parameters thereof are changed by ion energy when passing therethrough. The intensity of the acceleration electric field affects the convergence and divergence, and therefore, the values thereof are determined after radio-frequency parameters are determined.

In the acceleration method using the electrostatic field, ion beam energy E [keV] is uniquely determined from the power supply voltage V [kV] producing the electrostatic field and the valence n of the extracted ions. In this case, the ion energy is expressed as $$E = n \cdot V \quad \text{Formula (2)}$$

Therefore, in the magnetic field measurement itself of the energy analysis electromagnet, there is no direct role in determining the energy.

However, for example, in the ion implantation apparatus using the radio-frequency (RF) acceleration, the ion beam energy after acceleration has a spread. Therefore, before ions are implanted into the substrate such as a silicon wafer, it is necessary to select only an ion beam having desired energy by analyzing energy with an electric field or a magnetic field. Generally, an electromagnet is used in the analysis because of its easy handling, but in this case, it is necessary to calculate energy from the magnetic field of the electromagnet because energy of the ion beam has spread.

The ion energy E [key] is expressed as $$E = 4.824265 \times 10^4 \times (B^2 \cdot \rho^2 \cdot n^2)/m \quad \text{Formula (3)}$$

In this formula, m [amu] is mass number of the implanted ion, n is an electrostatic valence of the implanted ion, ρ [m] is a curvature radius of a beam trajectory within an electromagnet, and B [T] is a magnetic field (magnetic flux density). Among them, m and n are already known from an implantation condition, and ρ is constant. Therefore, the measurement of the magnetic field B directly leads to the measurement of the energy E.

Also, in an ion implantation apparatus for very low energy implantation, which has recently been developed, influence of potential of plasma on ion energy is not negligible. Therefore, it is difficult to determine exact ion beam energy by only an extraction voltage. Even in such a case, the energy calculation based on the exact magnetic field measurement of the final energy analysis electromagnet is effective.

(High-Energy Multi-stage Linear Acceleration Unit)

Figure 4:
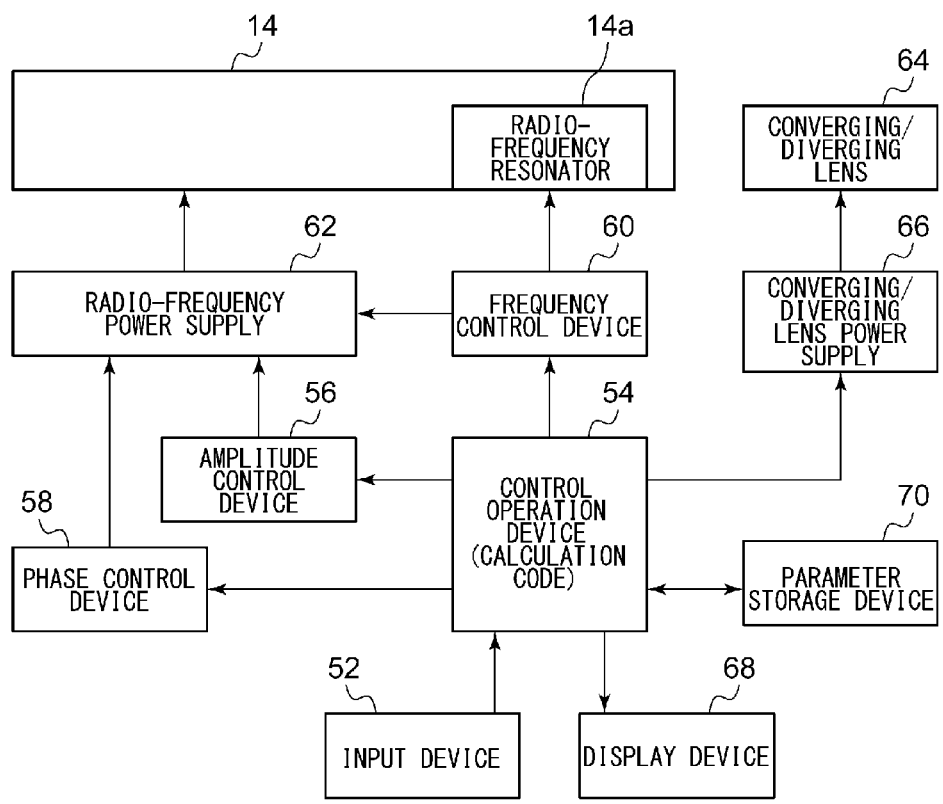
FIG. 4 is a block diagram illustrating a configuration of a high-energy multi-stage linear acceleration unit including a plurality of radio-frequency linear accelerators and a converging/diverging lens.

FIG. 4 is a block diagram illustrating a configuration of a control system of a high-energy multi-stage linear acceleration unit including a plurality of radio-frequency linear accelerators and a converging/diverging lens.

The high-energy multi-stage linear acceleration unit 14 includes one or more radio-frequency resonators 14a. Components necessary for controlling the high-energy multi-stage linear acceleration unit 14 include an input device 52 for allowing an operator to input a required condition, a control operation device 54 for numerically calculating various parameters from the input condition and further controlling each component, an amplitude control device 56 for adjusting an amplitude of a radio-frequency wave, a phase control device 58 for adjusting a phase of a radio-frequency wave, a frequency control device 60 for controlling a frequency of a radio-frequency wave, a radio-frequency power supply 62, a converging/diverging lens power supply 66 for a converging/diverging lens 64, a display device 68 for displaying operation parameters, and a storage device 70 for storing determined parameters. Also, the control operation device 54 is embedded with numerical calculation codes (program) for numerically calculating various parameters in advance.

The ion implantation apparatus accelerating ions with an electrostatic voltage can easily determine acceleration parameters analytically. Therefore, if an acceleration condition (valence of ion), desired energy, or the like is just input by the operator or is just instructed from an upper-level computer, a required acceleration parameter (voltage) is calculated in the control device of the ion implantation apparatus and is automatically set. Then, a parameter combination for obtaining a beam of target energy is found. That is, in order to obtain the beam of the target energy, a desired type of ion, a valence of ion, an extraction voltage of the ion source, and a finally required energy value are input to the input device 52 by the operator or the upper-level computer.

On the other hand, in the radio-frequency linear accelerator, the control operation device 54 simulates the acceleration or deceleration and the convergence or divergence of the ion beam based on the input condition by the embedded numerical calculation codes, and calculates the radio-frequency parameters (amplitude, frequency, phase) so as to obtain the optimum transport efficiency. Also, at the same time, parameters (at least one of a current and a voltage) of the converging/diverging lens 64 for efficiently transporting the ion beam are also calculated. The calculated various parameters are displayed on the display device 68. Regarding the acceleration and deceleration conditions beyond the capacity of the high-energy multi-stage linear acceleration unit 14, an indication meaning no solution is displayed on the display device 68.

The amplitude parameter is transmitted from the control operation device 54 to the amplitude control device 56, and the amplitude control device 56 adjusts the amplitude of the radio-frequency power supply 62. The phase parameter is transmitted to the phase control device 58, and the phase control device 58 adjusts the phase of the radio-frequency power supply 62. The frequency parameter is transmitted to the frequency control device 60. The frequency control device 60 controls an output frequency of the radio-frequency power supply 62, and controls a resonance frequency of the radio-frequency resonator 14a of the high-energy multi-stage linear acceleration unit 14. The control operation device 54 also controls the converging/diverging lens power supply 66 with respect to a calculated converging/diverging lens parameter.

The plurality of stages of the radio-frequency resonators 14a is alternately provided with diverging lenses or converging lenses. An additional diverging lens 64b is disposed behind the converging lens 64a at the end of the second linear accelerator 15b, and adjusts a convergence amount and divergence amount of the high-energy accelerated ion beam passing through the high-energy multi-stage linear acceleration unit 14 and makes an ion beam having an optimum two-dimensional beam profile to be incident into the deflection unit of a subsequent stage.

The ion beam after passing through the high-energy multi-stage linear acceleration unit 14 has spread in the energy distribution due to the influence of the radio-frequency electric field. Therefore, analysis, limitation, and separation are performed such that only ions of desired energy can be passed through the deflection unit 16 to be described below. Also, reference symbol L represents the center trajectory of the ion beam.

(Deflection Unit)

As illustrated in FIG. 1, the deflection unit 16 includes an energy filter 24 being an energy filter deflection magnet (E.F.M.), a trajectory adjustment quadrupole lens 26, an energy defining slit 28, and an angle deflection magnet 30. A plurality of electromagnets used in the deflection unit 16 according to the present embodiment is configured as follows.

The deflection unit 16 uses a plurality of electromagnet devices as an energy analysis device and a lateral bending (beam path changing) device, and the energy defining slit 28 is disposed between the energy filter 24 and the angle deflection magnet 30. At least one of electromagnets disposed upstream of the energy defining slit 28 is configured as the energy analysis device (energy filter 24), and at least one of electromagnets disposed downstream of the energy defining slit is used as the lateral bending device (angle deflection magnet 30).

Also, the trajectory adjustment quadrupole lens 26 is disposed as a transverse converging lens in the upstream side of the energy defining slit 28 between the energy defining slit 28 and the energy filter 24. The trajectory adjustment quadrupole lens 26 can be configured by, for example, electrostatic field type or magnetic field type. Also, in order to stably operate the vacuum pump, it is preferable to dispose the vacuum pump at a position that is not affected by a leakage magnetic field of the electromagnet of the energy filter 24 or the angle deflection magnet 30. For example, a vacuum pump for outgas exhausting may be disposed in the vicinity of the energy defining slit 28.

Thus, the deflection unit 16 can deflect the ion beam 180 degrees by using a plurality of magnets. Therefore, the ion implantation apparatus 100 having the u-shaped beamline can be realized by a simple configuration.

Also, the energy filter 24 including the electromagnet, which is provided on the upstream side of the energy defining slit 28, may be configured to be attached/detached or connected to the high-energy multi-stage linear acceleration unit 14 of the upstream. Also, when the beam transport line unit 18 to be described below is configured by a module-type beamline unit, the angle deflection magnet 30, which is disposed on the downstream side of the energy defining slit 28, may be configured to be attached/detached or connected to the beam transport line unit 18 of the downstream.

Figure 5A:
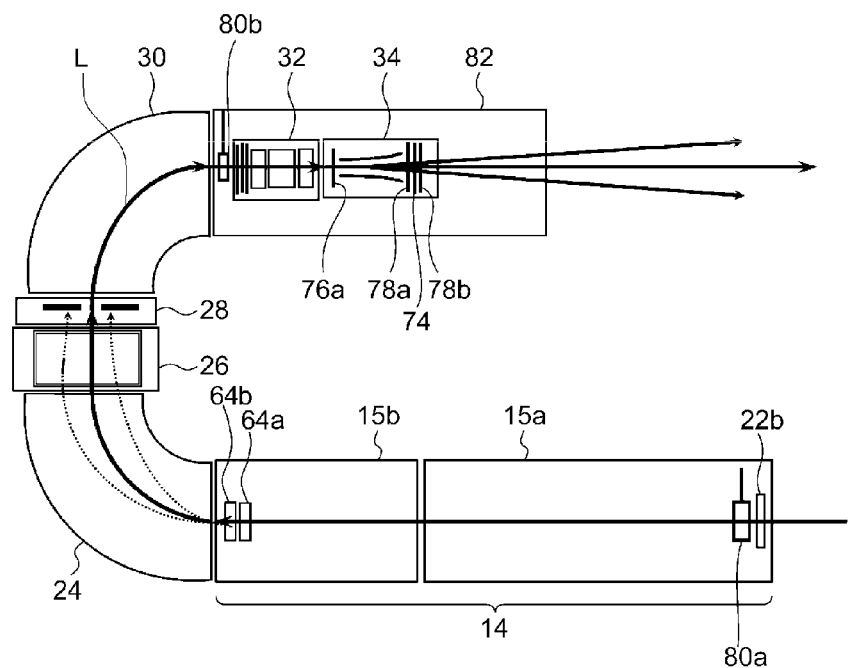
FIGS. 5A and 5B are plan views illustrating a schematic configuration of an energy filter magnet (EFM)/an energy defining slit/a bending magnet (BM), a beam shaper, and a beam scanner.

As illustrated in FIG. 5A to be described below, the deflection unit 16 deflects the ion beam output from the high-energy multi-stage linear acceleration unit 14 by 90 degrees with the energy filter 24. The ion beam output from the high-energy multi-stage linear acceleration unit 14 has a spread in the energy distribution. Therefore, the energy filter 24 is performed by transversely dispersing the beam trajectory with respect to the spread of the width of the energy by the energy filter 24 (due to the difference of energy) and passing through only the ion beam of required energy transversely in the energy defining slit 28. The beam trajectory is deflected 90 degrees by the angle deflection magnet 30 and is incident into the beam shaper 32 of the beam transport line unit 18 to be described below. The beam shaper 32 shapes the incident beam and supplies the shaped beam to the beam scanner 34. Also, as illustrated in FIG. 5B to be described below, the deviation of the ion beam trajectory due to the slight distribution of the beam energy is adjusted by the lens effect of the trajectory adjustment quadrupole lens 26, so that the beams arriving at the wafer become an almost single trajectory.

As described above, in the ion implantation apparatus that accelerates the ions generated in the ion source, transports the ions to the wafer, and implants the ions, the deflection unit 16 performs 180 degrees deflection of the ion beam between the high-energy multi-stage linear acceleration unit 14 and the beam transport line unit 18 by using a plurality of magnets. That is, the magnet of the energy filter 24 and the angle deflection magnet 30 are configured such that each deflection angle becomes 90 degrees, and as a result, the total deflection angle becomes 180 degrees. Also, a deflection amount performed by the single magnet is not limited to 90 degrees, and may be any one of the following combinations.

(1) One magnet having a deflection amount of 90 degrees+two magnets each having a deflection amount of 45 degrees (2) Three magnets each having a deflection amount of 60 degrees (3) Four magnets each having a deflection amount of 45 degrees (4) Six magnets each having a deflection amount of 30 degrees (5) One magnet having a deflection amount of 60 degrees+one magnet having a deflection amount of 120 degrees (6) One magnet having a deflection amount of 30 degrees+one magnet having a deflection amount of 150 degrees (Beam Transport Line Unit)

Figure 5B:
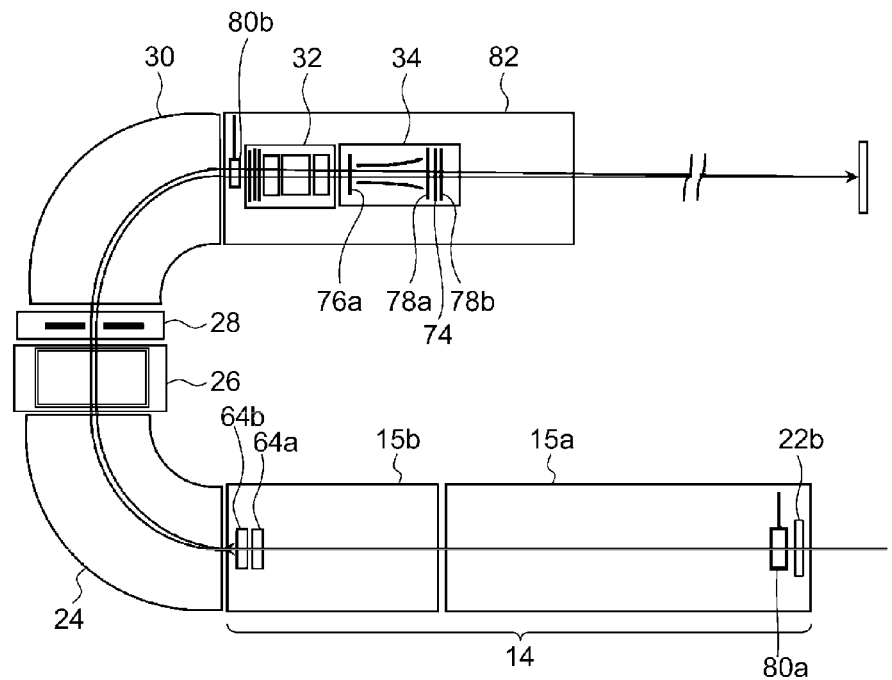

FIGS. 5A and 5B are plan views illustrating a schematic configuration of the EFM/the energy analysis/BM, the beam shaper, and the beam scanner. FIG. 6A is a plan view illustrating a schematic configuration from the beam shaper to the substrate supplying/processing unit after the beam collimator, and FIG. 6B is a side view illustrating a schematic configuration from the beam shaper to the substrate supplying/processing unit after the beam collimator.

Only required ion species are separated by the deflection unit 16, and a beam consisting of the ions of a required energy value is shaped to have a desired cross-sectional shape by the beam shaper 32. As illustrated in FIGS. 5 and 6, the beam shaper 32 is configured by a converging/diverging lens group of Q (quadrupole)-lenses or the like (electrostatic type or magnetic field type). The beam having the shaped cross-sectional shape is scanned in a direction parallel to the plane of FIG. 1 by the beam scanner 34. For example, the beam shaper 32 is configured by a triplet Q lens group including a longitudinal converging (transverse diverging) lens QF/a longitudinal diverging (transverse converging) lens QD/a longitudinal converging (transverse diverging) lens QF. The beam shaper 32, if necessary, may be configured by the longitudinal converging/transverse diverging lens QF solely or the longitudinal diverging/transverse converging lens QD solely or in combination thereof.

The beam scanner 34 is a deflection scanning device that periodically reciprocally scans the ion beam in a horizontal direction perpendicular to a traveling direction of the ion beam by a periodically varying electric field.

In the case of the electrostatic type (electric field type) deflection scanning device, the beam scanner 34 includes a pair (two sheets) of opposite scan electrodes (two-pole type deflection scan electrodes) disposed to face each other with a gap over a passage region of the ion beam with respect to a beam traveling direction. Scan voltages for performing a positive and negative voltage change control approximated to a periodically-varying triangular wave of several Hz to several kHz are applied to two opposite electrodes at voltages of opposite signs. Within the gap, the scan voltages generate an electric field for deflecting a beam passing through the gap. By changing the scan voltages, the beam passing through the gap is scanned in a horizontal direction.

In the downstream side of the beam scanner 34, a suppression electrode 74 having an opening in a passing region of the ion beam is disposed between two ground electrodes 78a and 78b. In the upstream side, a ground electrode 76a is disposed in front of the scan electrode, but if necessary, the suppression electrode may be disposed just behind the ground electrode. The suppression electrode suppresses the inflow of electrons into the positive electrode.

As illustrated in FIG. 5, injector flag Faraday cups 80a and 80b for measuring the total beam current value of the ion beam are disposed, respectively, in a foremost part within a linear acceleration unit housing of the high-energy multi-stage linear acceleration unit 14 and in an immediately preceding part of the beam shaper 32 of the foremost part within a scanner housing 82. The injector flag Faraday cups 80a and 80b are configured to be removable in a vertical direction (or a horizontal direction) on the beamline by a driving mechanism, are configured such that an opening having a horizontally long rectangular shape is directed toward the beamline upstream side, and are used for completely blocking the ion beam arriving at the beamline downstream on the beamline, if necessary, in addition to the purpose of measuring the total beam current of the ion beam incident on the opening. Also, the injector flag Faraday cup and 80b, the beam scanner 34, the suppression electrode 74, and the ground electrodes 76a, 78a and 78b are received in the scanner housing 82. Also, as described above, the mass analysis slit 22b is disposed within the inlet portion of the high-energy multi-stage linear acceleration unit 14 just before the injector flag Faraday cup 80a, and is configured in a single mass analysis slit or a selection method of a plurality of slits having different widths according to the magnitude of mass, or a method that can modify a mass slit width in no stage or multi-stages.

Within the scan housing 82, a beam drifting space after beam scanning is provided with a long section in the downstream side of the beam scanner 34, and is configured to obtain a sufficient scan width even when a beam scan angle is narrow. In the rear of the scan housing 82, which is the downstream of the beam drifting space after beam scanning, the beam collimator 36 is provided to perform re-deflection such that the deflected ion beam has the same direction as the ion beam prior to the beam scan deflection, that is, the deflected ion beam becomes parallel to the beamline.

A parallel lens 84 is disposed in the beam collimator 36. As illustrated in FIG. 6, the parallel lens 84 is configured by an assembly of pairs of an upper unit and a lower unit, a space through which the ion beam passes is provided between the upper unit and the lower unit. The assembly of the pairs of the upper unit and the lower unit is configured by a plurality of electrodes having an arcuate shape, a non-circular curved shape, a substantially arc shape, a dogleg shape, or the like, and the initial electrode (first electrode) and the last electrode (third electrode) from the upstream side are maintained at ground potential. A collimator power supply (variable negative power supply in a single stage, or negative/positive/negative or negative/positive/negative/positive/negative in an n-stage) 90 is connected to the middle electrode. By generating a deflection electric field (which has a beam convergence effect) changing the beam trajectory between the first electrode and the second electrode and between the second electrode and the third electrode, the ion beam receives an operation that is directed stepwise for a direction parallel to the beamline trajectory direction, and the ion beam deflected in a horizontal direction becomes an ion beam parallel to an ion beam traveling direction (beamline trajectory direction) prior to the deflection scanning. Also, suppression electrodes blocking the inflow of electrons may be separately disposed immediately before the initial electrode (first electrode) and/or immediately after the last electrode (third electrode). In the case of performing collimation by the electric field described above, acceleration or deceleration occurs between the respective electrodes and the ion energy varies in the regions. However, potentials of the inlet and outlet of the collimating unit are equal to each other. Therefore, it is configured such that the energy is not changed as a whole.

Thus, the beam scanned by the beam scanner 34 is collimated by the beam collimator 36 including the parallel lens and the like, and becomes parallel to an axis of a deflection angle of 0 degree which is identical to the ion beam traveling direction (beamline trajectory direction) prior to scanning.

The ion beam output from the parallel lens 84 is transmitted to the angular energy filter (AEF) 94 constituting the final energy filer 38. The angular energy filter 94 performs a final analysis on the ion beam energy immediately before implantation into the wafer, selects only ion species having a required energy value, and removes neutral particles having no electric charge or ions having different valences. The angular energy filter (AEF) 94 applying the electric field deflection is configured by a pair of plate-shaped deflection electrodes that have a planar or curved surface and face each other in a direction vertical to the beamline trajectory direction. The angular energy filter 94 is bent along the beam trajectory directed downward by the deflection affect of the angular energy filter (AEF) 94 itself.

As illustrated in FIGS. 6A and 6B, the electrode for electric field deflection is configured by a pair of AEF electrodes 104 and is disposed such that the ion beam is interposed therebetween in a vertical direction. A positive voltage is applied to the upper AEF electrode of the pair of AEF electrodes 104, and a negative voltage is applied to the lower AEF electrode thereof. In the case of deflection by the electric field, the ion beam is deflected downward about 10 to 20 degrees by the effect of the electric field generated between the pair of AEF electrodes 104, and thus, only the ion beam of the target energy is selected. As illustrated in FIG. 6B, only the ion beam having the energy value selected in the angular energy filter 94 is deflected downward by a set trajectory angle. The beam having only the ion species selected in this manner is irradiated on the wafer 200 that is an irradiation target object.

Figure 10:
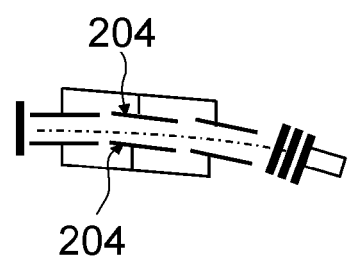
FIG. 10 is a schematic view illustrating another aspect of a deflection electrode of an angular energy filter.

Also, as illustrated in FIG. 10, the pair of plate-shaped deflection electrodes 204 facing each other in a vertical direction may be plate-shaped electrodes that are divided by n back and forth when bent along the ion beam trajectory so that the upper electrode and the lower electrode are maintained at the same potential, respectively. Also, in addition to the configuration that the upper electrode and the lower electrode are maintained at the same potential, respectively, the plate-shaped deflection electrodes divided by n back and forth can be also set to different potentials (fixed or variable potential).

Also, the angular energy filter 94 works with an electrode set provided with a ground electrode 108 in the upstream side of the angular energy filter 94 and an AEF suppression electrode 110 between two ground electrodes of the downstream side. The AEF suppression electrode 110 suppresses the inflow of electrons into the positive electrode.

The beam current amount which correlates with implanted dose amount is measured by dose cups 122 disposed on left and right ends of the ground electrode of the most downstream side of the angular energy filter 94. Also, a striker plate 114, which receives neutral particles going straight without being deflected by the angular energy filter 94, may be provided at an outlet side of an AEF chamber 102.

Also, an arrow indicated adjacent to the wafer 200 in FIG. 6A represents the scanning of the beam in a direction of the arrow, and an arrow indicated adjacent to the wafer 200 in FIG. 6B represents the reciprocation of the wafer 200 in a direction of the arrow, that is, mechanical scanning. That is, when it is assumed that the beam is, for example, reciprocally scanned in a uniaxial direction, the wafer 200 is driven to reciprocate in a direction perpendicular to the uniaxial direction by a driving mechanism (not illustrated).

The substrate supplying/processing unit 20, which transfers and supplies the wafer 200 to a predetermined position and performs processing by ion implantation, includes a process chamber (implantation processing chamber) 116. The process chamber 116 communicates with the AEF chamber 102. An energy defining slit (EDS) 118 is disposed within the process chamber 116. The energy defining slit 118 is configured by a slit horizontally long in a beam scan direction in order to precisely separate only an ion beam having a desired energy value and valence passing through the AEF by limiting passage of an ion beam having a undesired energy value and a valence. Also, the energy defining slit 118 may constitute a slit body by a member that is movable in a vertical direction in order to adjust a separation gap of the slit. Also, a movable vertical switching slit member may have a plurality of slit sides and may be configured to switch the slit sides to change to a desired slit width by adjusting in a vertical direction or by rotating around an axis. By switching the plurality of slit sides according to the ion species, a configuration of reducing cross-contamination is also possible.

A plasma shower 120 supplies low-energy electrons to the ion beam on the trajectory and the front surface of the wafer 200 according to the beam current amount of the ion beam, and neutralizes positive charge-up produced by ion implantation. Also, instead of the dose cups 122 disposed at the left and right ends of the ground electrode of the most downstream side of the angular energy filter 94, dose cups (not illustrated) for measuring the dose amount may be disposed at the left and right ends of the plasma shower 120. Specifically, since the ion beam entering the left and right dose cups connected to a current measurement circuit is neutralized by electrons flowing from the GND potential of the circuit, the measurement of the ion beam can be performed by measuring the flow of the electrons.

A beam profiler 124 includes a beam profiler cup (not illustrated) for performing intensity measurement of the beam current at an ion implantation position. The beam profiler 124 measures the ion beam density at the ion implantation position in the same direction as the beam scanning while moving in a horizontal direction before ion implantation and the like. As a result of the beam profile measurement, when predicted non-uniformity (PNU) of the ion beam does not satisfy process requirements, it is automatically adjusted to satisfy the process requirements by correcting a control function of the applied voltage of the beam scanner 34. Also, the beam profiler 124 may be provided with a vertical profiler cup (not illustrated) and be configured to measure a beam shape and a beam X-Y position, check the beam shape at the implantation position, and confirm a beam width or a beam center position.

A horizontally long Faraday cup 126, which has a beam current measurement function capable of measuring all ion beams of a scan range in a wafer region, is disposed at the most downstream of the beamline and is configured to measure a final setup beam. Also, in order to reduce cross-contamination, the horizontally long Faraday cup 126 can be a bottom surface switching type of a Faraday cup having a triple surface structure capable of switching three sides of a triangular prism according to the ion species.

As described above, in the ion implantation apparatus 100, each unit is disposed in the U shape so as to surround the work space R1 as illustrated in FIG. 1. Therefore, the operator working in the work space R1 can perform replacement, maintenance or adjustment with respect to parts of many units by minimummovement Hereinafter, as an example of the beam scanner, a closing and opening mechanism enabling access to the inside of the unit will be described.

Figure 7:
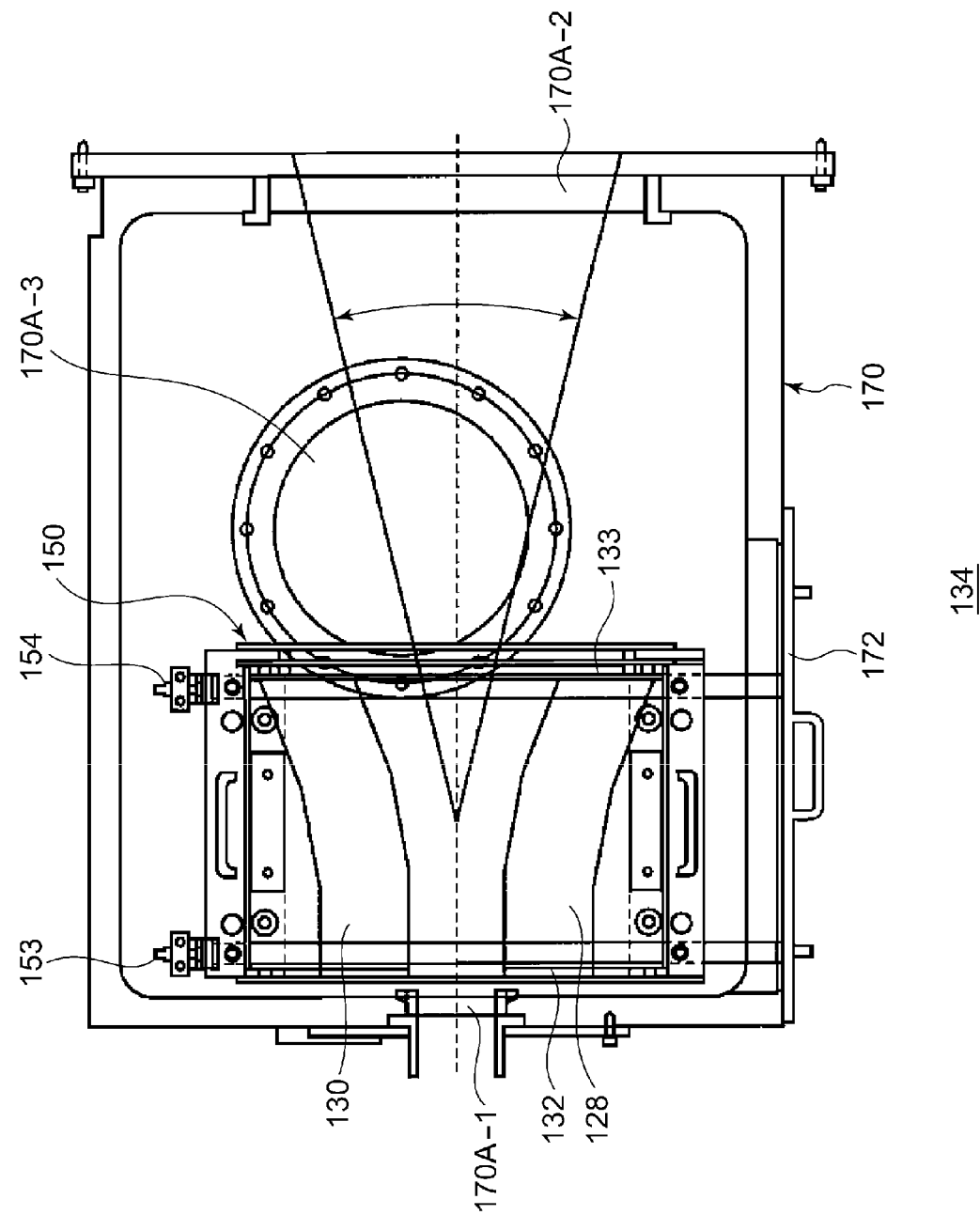
FIG. 7 is a cross-sectional view when viewed from above a main portion of an example of the beam scanner.
Figure 8:
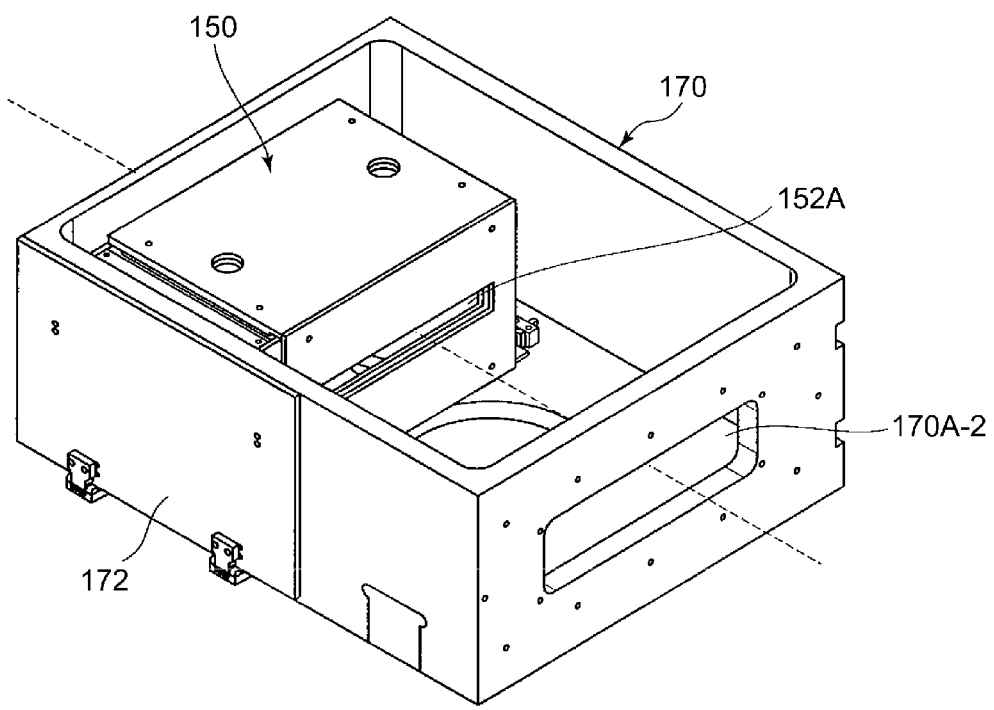
FIG. 8 is a perspective view illustrating an example of a detachable structure of the beam scanner.
Figure 9:
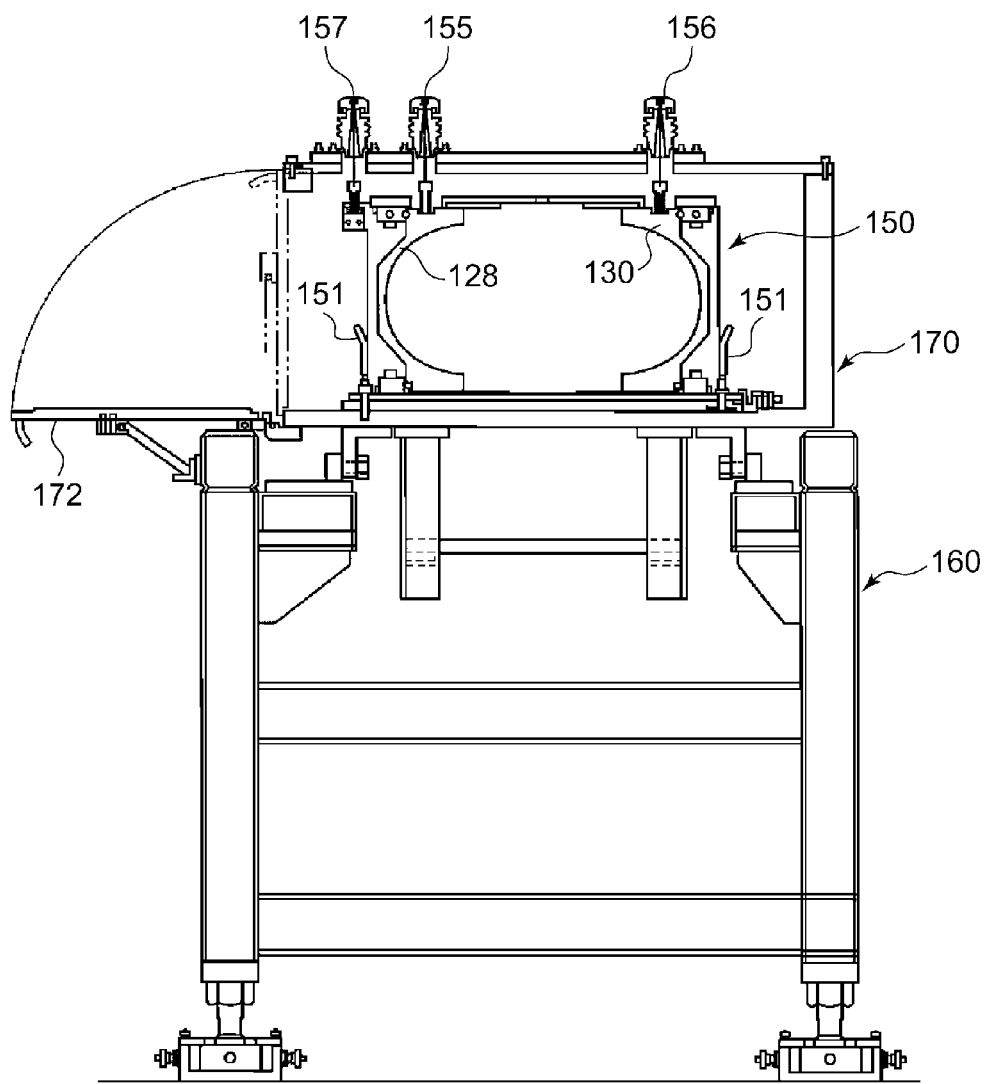
FIG. 9 is a front sectional view when viewed from a downstream side of a structure in which an example of the beam scanner is detachably mounted on a middle path of an ion beamline.

FIG. 7 is a cross-sectional view when viewed from above a main portion of an example of the beam scanner. FIG. 8 is a perspective view illustrating an example of a detachable structure of the beam scanner. FIG. 9 is a front sectional view when viewed from a downstream side of a structure in which an example of the beam scanner is detachably mounted on a middle path of an ion beamline.

In the beam scanner 134, as illustrated in FIGS. 7 and 8, a pair of deflection electrodes 128 and 130 are received and installed in a case 150 with ground electrodes 132 and 133 assembled near the upstream side and the downstream side thereof. At positions those are the upstream side and the downstream side of the case 150 and correspond to an openings of the ground electrodes 132 and 133, an opening (not illustrated) of the upstream side and an opening 152A (see FIG. 8) slightly larger than an opening of the ground electrode 133 are provided.

The connection between the deflection electrodes and the power supply is realized by a feed-through structure. A terminal 157 for connecting the suppression electrode and the power supply and terminals 155 and 156 for connecting the deflection electrodes 128 and 130 and the power supply are provided on the top surface of the case 150. Also, on the case 150, handles 151 convenient to detach or carry are provided on two lateral surfaces parallel to the beam axis. Also, an exhaust port 170A-3 illustrated in FIG. 7 is provided for vacuum exhaust to reduce a pressure inside the beam scanner 134, and is connected to a vacuum exhaust device (not illustrated).

As illustrated in FIG. 9, the case 150 is slidably installed within a beam guide box 170 that is fixed on a trestle 160. The beam guide box 170 is sufficiently larger than the case 150, and two guide rails for allowing the case 150 to be slidable are laid on the bottom thereof. The guide rails extend in a direction perpendicular to the beam axis, and a side of the beam guide box 170 is freely openable by a door 172. Therefore, at the time of maintenance and inspection of the beam scanner 134, the case 150 can easily be taken out from the beam guide box 170. Also, in order to lock the case 150 pushed into the beam guide box 170, locking mechanisms 153, 154 are provided at the other end of the guide rails. Openings 170A-1 and 170A-2 are provided at positions those are the upstream side and the downstream side of the beam guide box 170 and correspond to an upstream side opening and a downstream side opening 152A of the case 150.

The opening 170A-2 needs to be larger than the opening 152A because the outgoing beam is scanned. Lead wires (not illustrated) are connected to terminals 155 to 157, but are disconnected when the case 150 is attached or detached.

The unit members around the scanner are subject to the maintenance of the beamline, and the maintenance work can be easily performed from the work space R1. Likewise, the maintenance work of the high-energy multi-stage linear acceleration unit 14 can also be easily performed from the work space R1.

As described above, the ion implantation apparatus 100 according to the present embodiment accelerates the ion beam, which is generated by the ion beam generation unit 12, in the high-energy multi-stage linear acceleration unit 14, changes the direction of the ion beam by the deflection unit 16, and irradiates with the ion beam the substrate placed in the substrate supplying/processing unit 20 provided at the end of the beam transport line unit 18.

Also, the ion implantation apparatus 100 includes high-energy multi-stage linear acceleration units 14 and beam transport line units 18 as a plurality of units. The high-energy multi-stage linear acceleration unit 14 and the beam transport line unit 18 are disposed to face each other across the work space R1 illustrated in FIG. 1. Thus, since the high-energy multi-stage linear acceleration unit 14 and the beam transport line unit 18, which are preferably disposed as a straight line, are separately disposed, the total length of the ion implantation apparatus 100 can be suppressed. Also, in the work space R1 interposed between the high-energy multi-stage linear acceleration unit 14 and the beam transport line unit 18, the work on each device of the high-energy multi-stage linear acceleration unit 14 or the beam transport line unit 18 is possible.

Also, the plurality of units constituting the ion implantation apparatus 100 includes the ion beam generation unit 12 provided in the upstream side of the beamline and configured to generate the ion beam, the substrate supplying/processing unit 20 provided in the downstream side of the beamline and configured to supply and process the substrate into which ions are to be implanted, and the deflection unit 16 provided in the middle of the beamline directed from the ion beam generation unit 12 to the substrate supplying/processing unit 20 and configured to deflect the trajectory of the ion beam. The ion beam generation unit 12 and the substrate supplying/processing unit 20 are disposed in one side of the entire beamline, and the deflection unit 16 is disposed in the other side of the entire beamline. Thus, since the ion source 10 requiring the maintenance or the substrate supplying/processing unit 20 requiring the supplying and ejecting of the substrate are disposed adjacent to each other, the movement of the operator is reduced.

Also, the high-energy multi-stagelinear acceleration unit 14 includes a plurality of a series of linear accelerators that perform the ion acceleration, and each of the plurality of the series of linear accelerators may include a common connection portion. This can easily change the number or type of the linear accelerators according to the energy necessary for ions to be implanted into the substrate.

Also, the beam scanner 34 being the scanner device and the beam collimator 36 being the parallel lens device may have a standardized shape as a connection portion to the adjacent unit. The beam scanner 34 and/or the beam collimator 36 may be selected according to the configuration and number of the linear accelerators included in the high-energy multi-stage linear acceleration unit 14. This can easily change the number or type of the linear accelerators.

Also, the ion implantation apparatus 100 may be configured such that the centering (position adjustment) of the beam is enabled by integrating each device frame and the vacuum chamber and assembling them based on the reference position of the device frame or the vacuum chamber. Thus, since a complicated centering work is minimized, a device start-up time can be reduced, and the occurrence of axial deviation due to operation mistakes can be suppressed. Also, the centering between successive vacuum chambers may be performed in units of modules. This can reduce the work load. Also, the size of the modularized device may be smaller than the size for easy movement of the device. This can reduce the relocation load of the module or the ion implantation apparatus 100.

Also, in the ion implantation apparatus 100, constituent devices including the high-energy multi-stage linear acceleration unit 14, the beam transport line unit 18, the exhaust device, and the like may be incorporated into an integrated trestle. Also, the ion implantation apparatus 100 includes the high-energy multi-stage linear acceleration unit 14, the deflection unit 16, and the beam transport line unit 18 in a substantially horizontal plane on a planar base. Therefore, since it is possible to transport the ion implantation apparatus 100 with each block separated after adjusting it in a state of being fixed to the planar base of the horizontal plane, the occurrence of adjustment deviation during transport is reduced, and troubles of re-adjustment in the fields can be greatly reduced. Therefore, it is possible to avoid the diseconomy that a plurality of skilled persons are dispatched and stay for a long period of time.

Also, if the planar base is formed in not the bottom but the middle of the trestle, only the devices directly associated with the ion beam trajectory can be mounted on the planar base. By incorporating members, such as a radio-frequency three-dimensional circuit being an auxiliary device with respect to them, into the space formed below the planar base, the space utilization can be improved, which in turn realizes a more compact ion implantation apparatus.

Therefore, the above-described ion implantation apparatus 100 can be installed even at a location having no sufficient installation site, and can be transported to a demand area in a state of being assembled in a manufacturing factory, be fixed in the field, and be used with the final adjustment. Also, the ion implantation apparatus 100 can realize high-energy ion implantation that can withstand the practical use in the standard semiconductor manufacturing factory.

Also, by devising the layout of each unit or each device, the ion implantation apparatus 100 is greatly downscaled as compared with the prior art, and can be placed in half the installation length of the related art. In the ion implantation apparatus according to the present embodiment, each component may be incorporated on the base in the manufacturing factory, be mounted on a transporter while establishing the ion beam trajectory by position adjustment on the base, be transported to the site, and be operated after fine-adjusting deviations occurring during transport with the trestle being installed. Therefore, even an unskilled person can perform adjustment on site very easily and reliably and the start-up period can be reduced.

Also, by taking the layout such as a long-U-shaped folder type beamline, it is possible to realize the ion implantation apparatus that can implant high-energy ions of maximum 5 to 8 MeV with high accuracy. Also, due to the layout having the central passage (central region), the ion implantation apparatus has a sufficient maintenance area even in a small installation area. Also, during the operation of the ion implantation apparatus, power consumption can be reduced by low power consumption operation according to the use of the electrostatic parallel lens, the electrostatic scanner, the electrostatic AEF, or the like. In other words, the ion implantation apparatus according to the present embodiment can be operated at low power consumption because the ion implantation apparatus has the scan beam collimating mechanism according to the use of the electrostatic deflection type parallel lens device.

The present invention is described with reference to the above-described embodiments, but the present invention is not limited to the above-described embodiments. Appropriate combinations or substitutions of the configurations of the embodiments will fall within the scope of the present invention. Also, combinations of the embodiments, rearrangements of the processing order, or various design modifications can be added to the respective embodiments, based on the knowledge of those skilled in the art, and the modified embodiments will also fall within the scope of the present invention.

Priority is claimed to Japanese Patent Application No. 2012-265844, filed Dec. 4, 2012, the entire content of which is incorporated herein by reference.

What is claimed is:

1. An ion implantation apparatus comprising:
   a plurality of units for accelerating an ion beam generated in an ion source; and
   a plurality of units for adjusting a scan beam and implanting ions into a wafer, wherein
   a horizontal U-shaped loop-back type beamline having opposite long straight portions includes the plurality of units for adjusting the scan beam in a long straight portion to have a length substantially identical to those of the ion source and the plurality of units for accelerating the ion beam.

2. The ion implantation apparatus according to claim 1, wherein
   a work space allowing a work on the plurality of units is provided in a central region of the U-shaped loop-back type beamline having the opposite long straight portions, and the ion implantation has a layout with the central region as a maintenance area.

3. The ion implantation apparatus according to claim 2, wherein
   the plurality of units includes a high-energy multi-stage linear acceleration unit and a beam transport line unit, and
   the high-energy multi-stage linear acceleration unit and the beam transport line unit are disposed to face each other across the work space of the U-shaped folder type beamline.

4. The ion implantation apparatus according to claim 3, wherein
   the plurality of units includes:
   an ion beam generation unit provided in an upstream side of the beamline and configured to generate the ion beam;
   a substrate supplying/processing unit provided in a downstream side of the beamline and configured to supply and process a substrate into which ions are to be implanted; and
   a deflection unit provided in a middle of the beamline directed from the ion beam generation unit to the substrate supplying/processing unit and configured to deflect a trajectory of the ion beam,
   the ion beam generation unit and the substrate supplying/processing unit are disposed in one side of the entire beamline, and
   the deflection unit is disposed in the other side of the entire beamline.

5. The ion implantation apparatus according to claim 4, wherein
   the ion beam generation unit includes an ion source, an extraction electrode, and a mass analyzer,
   the deflection unit includes an energy filter,
   the beam transport line unit includes a beam shaper, a beam scanner, a beam collimator, and a final energy filter, and
   the ion implantation apparatus accelerates the ion beam, which is generated by the ion beam generation unit, in the high-energy multi-stage linear acceleration unit, changes a trajectory of the ion beam by the deflection unit, and irradiates with the ion beam the substrate placed in the substrate supplying/processing unit provided at the end of the beam transport line unit.

6. The ion implantation apparatus according to claim 4, wherein
   the deflection unit includes an energy filter magnet, a trajectory adjustment lens, an energy defining slit, and an angle deflection magnet.

7. The ion implantation apparatus according to claim 6, wherein
   the energy filter magnet and the angle deflection magnet are configured such that a total deflection angle becomes 180 degrees.

8. The ion implantation apparatus according to claim 6, wherein
   the energy filter magnet and the angle deflection magnet are configured such that each deflection angle becomes 90 degrees.

9. The ion implantation apparatus according to claim 2, wherein
   the ion implantation apparatus has a scan beam collimation system made by using an electrostatic deflection type parallel lens device.

10. The ion implantation apparatus according to claim 2, wherein
    a communication passage allowing an operator to move between the work space and an outside is provided in an inlet portion of the U-shaped folder type beamline.

11. An ion implantation apparatus comprising:
    a first section having a long beamline made by an ion beam generation unit and a high-energy multi-stage linear acceleration unit;
    a second section for changing a trajectory of the ion beam by a deflection unit including an energy filter; and
    a third section having a long beamline made by a beam transport line unit including a beam shaper device, a scanner device, an electrostatic parallel lens device, and a final energy filter, wherein
    the first section, the second section, and the third section form a high-energy ion implantation beamline, and
    the first section and the third section are disposed to face each other to form a U-shaped device layout having opposite long straight portions that realize high-energy high-accuracy implantation.

* * * * *